United States Patent
Kang et al.

(10) Patent No.: US 9,929,672 B2
(45) Date of Patent: Mar. 27, 2018

(54) RECTIFIER HAVING REDUCED SWITCHING LOSS

(71) Applicants: Samsung Electro-Mechanics Co., Ltd., Suwon-si (KR); Research & Business Foundation Sungkyunkwan University, Suwon-si (KR)

(72) Inventors: Chang Soo Kang, Suwon-si (KR); Chul Gyun Park, Suwon-si (KR); Kang Yoon Lee, Seoul (KR); Joo Young Chun, Seoul (KR)

(73) Assignees: Samsung Electro-Mechanics Co., Ltd., Suwon-si (KR); Research & Business Foundation Sungkyunkwan University, Suwon-si (KR)

( * ) Notice: Subject to any disclaimer, the term of this patent is extended or adjusted under 35 U.S.C. 154(b) by 56 days.

(21) Appl. No.: 15/041,096

(22) Filed: Feb. 11, 2016

(65) Prior Publication Data

US 2016/0352248 A1    Dec. 1, 2016

(30) Foreign Application Priority Data

May 28, 2015   (KR) .......... 10-2015-0075108

(51) Int. Cl.
*H02M 7/219*   (2006.01)
*H03K 17/16*   (2006.01)

(52) U.S. Cl.
CPC .......... *H02M 7/219* (2013.01); *H03K 17/161* (2013.01); *H02M 2007/2195* (2013.01); *H03K 2217/0045* (2013.01); *Y02B 70/1408* (2013.01)

(58) Field of Classification Search
CPC .......... H02M 2007/2195; H02M 7/219; Y02B 70/1408; H03K 17/161; H03K 2217/0045
See application file for complete search history.

(56) References Cited

U.S. PATENT DOCUMENTS

| 2010/0046264 A1* | 2/2010 | Ho ................... H02M 7/219 363/127 |
| 2010/0188876 A1* | 7/2010 | Garrity ............. H02M 1/4225 363/127 |
| 2012/0274132 A1* | 11/2012 | Membretti ............. H02M 1/08 307/9.1 |
| 2013/0154492 A1* | 6/2013 | Summerland ......... H02M 7/219 315/200 R |
| 2013/0215657 A1* | 8/2013 | Heath .................... H02M 1/38 363/127 |
| 2014/0268956 A1 | 9/2014 | Teren et al. |

(Continued)

FOREIGN PATENT DOCUMENTS

KR    10-1381940 B1    4/2014

*Primary Examiner* — Henry Lee, III
(74) *Attorney, Agent, or Firm* — NSIP Law (57) ABSTRACT

A rectifier includes: first and second high side switches including source terminals connected to an alternating current input terminal and drain terminals connected to one end of an output capacitor; first and second low side switches including drain terminals connected to the alternating current input terminal and source terminals connected to a ground terminal and another end of the output capacitor; and a cross connector configured to allow parasitic capacitance of the first high side switch or the second high side switch to flow to a ground when the first high side switch or the second high side switch is turned off.

15 Claims, 6 Drawing Sheets

(56) References Cited

U.S. PATENT DOCUMENTS

2015/0146466 A1* 5/2015 Kim .................. H02M 7/219
                                                363/127
2015/0263534 A1* 9/2015 Lee .................. H02M 7/219
                                                307/104

* cited by examiner

RECTIFIER HAVING REDUCED SWITCHING LOSS

CROSS-REFERENCE TO RELATED APPLICATION(S)

This application claims the benefit of Korean Patent Application No. 10-2015-0075108 filed on May 28, 2015 in the Korean Intellectual Property Office, the entire disclosure of which is incorporated herein by reference for all purposes.

BACKGROUND

1. Field

The following description relates to a rectifier.

2. Description of Related Art

Various electronic devices receive high voltage alternating current (AC) power, convert the high voltage AC power into direct current (DC) power, and use the DC power as driving power. To this end, the electronic devices use a rectifier that converts high voltage AC power into DC power having a predetermined power level.

In such a rectifier, even when high voltage AC power is input, it is important to efficiently convert the high voltage AC power into DC power. To this end, a large switching device has conventionally been used. That is, such a large switching device has been used to supply a sufficient amount of current. However, in such a conventional rectifier, there is a problem that, as the switching device is increased in size, when the switching device performs a switching off operation, that is, when the switching device is converts power from a high power level to a low power level, dissipation of charges stored in a parasitic capacitor in the switching device may be delayed.

Therefore, parasitic capacitance is present in the switching device seen from a load end. Thus, a falling edge of the switching device is bluntly formed, and a predetermined period of time is required to discharge the switching device. As a result, switching loss may occur.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to one general aspect, a rectifier includes: first and second high side switches including source terminals connected to an alternating current input terminal and drain terminals connected to one end of an output capacitor; first and second low side switches including drain terminals connected to the alternating current input terminal and source terminals connected to a ground terminal and another end of the output capacitor; and a cross connector configured to allow parasitic capacitance of the first high side switch or the second high side switch to flow to a ground when the first high side switch or the second high side switch is turned off.

The cross connector may include: a first cross switch including a gate terminal connected to a gate of the first high side switch and a drain terminal connected to a gate of the second high side switch; and a second cross switch including a gate terminal connected to the gate of the second high side switch and a drain terminal connected to the gate of the first high side switch.

The first and second cross switches may include source terminals connected to the ground terminal.

The first and second high side switches may be configured to operate alternately according to a change in polarities of input alternating current voltages.

The first low side switch and the second low side switch may be configured to perform switching operations in correspondence with the second high side switch and the first high side switch, respectively.

The cross connector may include: a first cross switch including a drain terminal connected to a gate of the first high side switch; and a second cross switch including a drain terminal connected to a gate of the second high side switch.

The first cross switch and the second cross switch may be configured to perform switching operations in correspondence with the first high side switch and the second high side switch, respectively.

According to another general aspect, a rectifier includes: first and second high side switches including source terminals connected to an alternating current input terminal and drain terminals connected to one end of an output capacitor; first and second low side switches including drain terminals connected to the alternating current input terminal and source terminals connected to a ground terminal and another end of the output capacitor; a cross connector configured to allow parasitic capacitance of the first high side switch or the second high side switch to flow to a ground when the first high side switch or the second high side switch is turned off; and first and second level shifters respectively connected to gate terminals of the first and second high side switches.

The first and second level shifters may be configured to respectively adjust gate voltages of the first and second high side switches such that gate-source voltages of the first and second high side switches are uniform.

The cross connector may include: a first cross switch including a gate terminal connected to a gate of the first high side switch and a drain terminal connected to a gate of the second high side switch; and a second cross switch including a gate terminal connected to the gate of the second high side switch and a drain terminal connected to the gate of the first high side switch.

The first and second cross switches may include source terminals connected to the ground terminal.

The first and second high side switches may be configured to operate alternately according to a change in polarities of input alternating current voltages.

The first low side switch and the second low side switch may be configured to perform switching operations in correspondence with the second high side switch and the first high side switch, respectively.

The cross connector may include: a first cross switch including a drain terminal connected to a gate of the second high side switch; and a second cross switch including a drain terminal connected to a gate of the first high side switch.

The first cross switch and the second cross switch may be configured to perform switching operations in correspondence with the first high side switch and the second high side switch, respectively.

According to another general aspect, a rectifier includes: first and second high side switches comprising source terminals connected to an alternating current input terminal and drain terminals connected to one end of an output capacitor; first and second low side switches comprising drain terminals connected to the alternating current input terminal and source terminals connected to a ground terminal and another end of the output capacitor; a first cross switch comprising a gate terminal connected to a gate of the first high side switch and a drain terminal connected to a gate of the second high side switch; and a second cross switch comprising a gate terminal connected to the gate of the second high side switch and a drain terminal connected to the gate of the first high side switch.

The first cross switch may be configured to allow parasitic capacitance in the second high side switch to flow to a ground through the first cross switch. The second cross switch may be configured to allow parasitic capacitance in the first high side switch to flow to the ground through the second cross switch.

The rectifier may further include level shifters connected to gate terminals of the first and second high side switches and configured to adjust gate voltages of the first and second high side switches such that gate-source voltages of the first and second high side switches are uniform.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Figure 1:
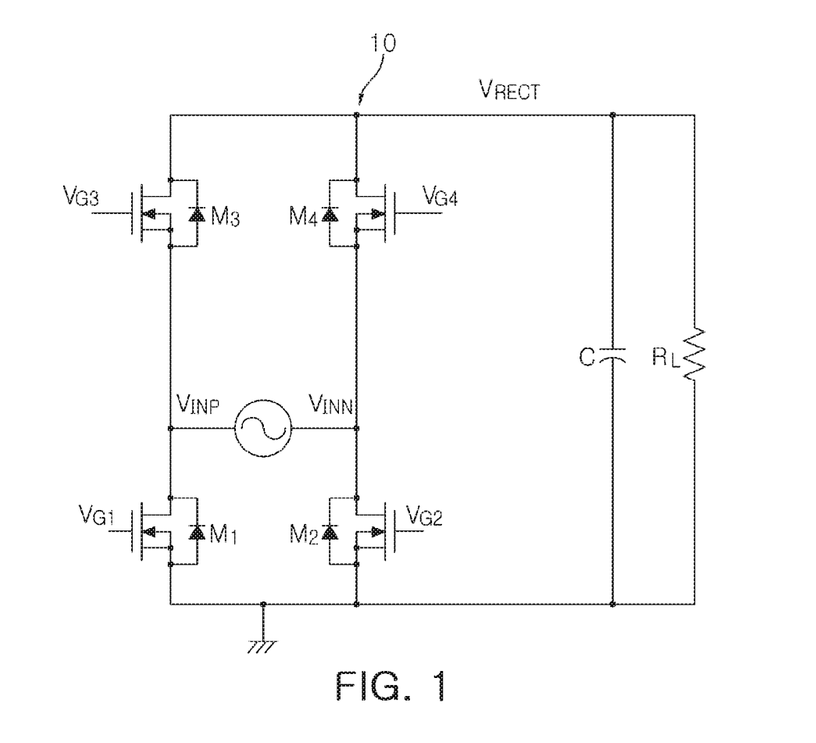
FIG. 1 is a circuit diagram of a rectifier according to an embodiment.

FIG. 1 is a circuit diagram of a rectifier 10 according to an embodiment. Referring to FIG. 1, the rectifier 10 includes first and second low side switches $M_1$ and $M_2$, first and second high side switches $M_3$ and $M_4$, and an output capacitor C.

The first and second low side switches $M_1$ and $M_2$ may operate alternately, according to polarities of input alternating current voltages $V_{INP}$ and $V_{INN}$. The first and second high side switches $M_3$ and $M_4$ may also operate alternately, according to the polarities of the input alternating current voltages $V_{INP}$ and $V_{INN}$.

For example, the first low side switch $M_1$ and the second high side switch $M_4$ can simultaneously perform a switching operation, and the second low side switch $M_2$ and the first high side switch $M_3$ can simultaneously perform the switching operation.

According to alternate switching operations of a plurality of switches, the input alternating current voltages $V_{INP}$ and $V_{INN}$ are accumulated in an output capacitor C, and a load $R_L$ uses voltages accumulated in the output capacitor C.

In the first and second low side switches $M_1$ and $M_2$, since a source is connected to a ground, gate voltages $V_{G1}$ and $V_{G2}$ may be maintained at a constant level (5V for example), whereas, in the first and second high side switches $M_3$ and $M_4$, since a source is connected to an input terminal, the gate voltages $V_{G3}$ and $V_{G4}$ may not be maintained at a constant level without a separate component, and thus a switching loss may occur.

Figure 2:
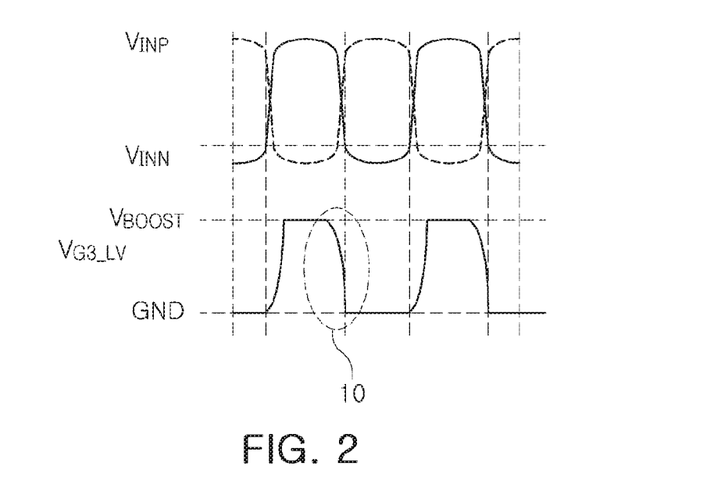
FIG. 2 is graph illustrating an example of a switching signal with respect to input alternating current (AC) voltages in the rectifier of FIG. 1.

FIG. 2 is graph illustrating an example of a switching signal with respect to the alternating current voltages $V_{INP}$ and $V_{INN}$ input to the rectifier of FIG. 1. The example of FIG. 2 illustrates a gate voltage $V_{G3}$ of the first high side switch $M_3$ with respect to alternating inputs of the input alternating current voltages $V_{INP}$ and $V_{INN}$.

As illustrated, a falling edge 10 of the gate voltage $V_{G3}$ of the first high side switch $M_3$ has a gentle curve. That is, a level $V_{G3\_LV}$ of the gate voltage $VG_3$ of the first high side switch $M_3$ is changed between GND and $V_{BOOST}$ with respect to alternating inputs of the input alternating current voltages $V_{INP}$ and $V_{INN}$. At this time, parasitic capacitance of the first high side switch $M_3$ is slowly removed, and thus the falling edge 10 of the gate voltage $V_{G3\_LV}$ has a gentle inclination. Thus, switching loss may occur, which may reduce efficiency of the rectifier.

In particular, in a rectifier using a high alternating current input voltage, as a size of a switching device increases, a capacity of the parasitic capacitance increases, and accordingly, switching loss may further increase.

Various embodiments in which switching loss may be prevented will be described below with reference to FIGS. 3 through 8.

Figure 3:
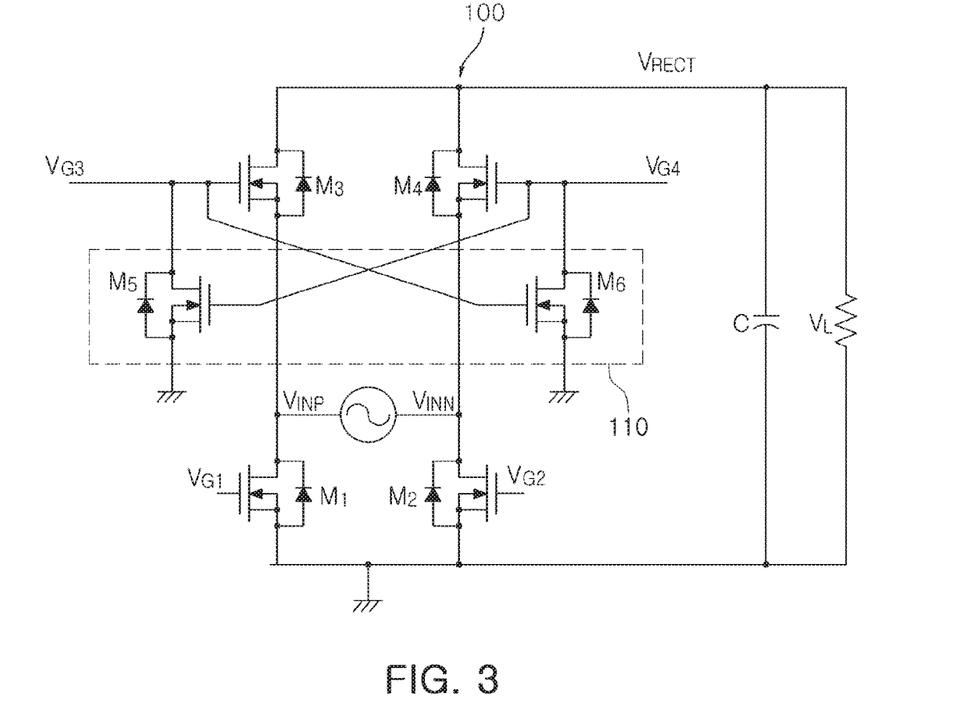
FIG. 3 is a circuit diagram of a rectifier according to another embodiment.

FIG. 3 is a circuit diagram of a rectifier 100 according to an embodiment.

Referring to FIG. 3, the rectifier 100 includes the first and second low side switches $M_1$ and $M_2$, the first and second high side switches $M_3$ and $M_4$, a cross connector 110, and the output capacitor C.

The first and second high side switches $M_3$ and $M_4$ have source terminals connected to an alternating current input terminal and drain terminals connected to a ground terminal and one end of the output capacitor C.

The first and second low side switches $M_1$ and $M_2$ have drain terminals connected to the alternating current input terminal and source terminals connected to another end of the output capacitor C.

The first and second low side switches $M_1$ and $M_2$ operate with respect to the gate voltages $V_{G1}$ and $V_{G2}$. The first and second high side switches $M_3$ and $M_4$ operate with respect to the gate voltages $V_{G3}$ and $V_{G4}$.

The cross connector 110 induces parasitic capacitance of the first and second high side switches $M_3$ and $M_4$ to a ground. That is, the cross connector 110 induces the parasitic capacitance of the first high side switch $M_3$ or the second high side switch $M_4$ to the ground when the first high side switch $M_3$ or the second high side switch $M_4$ performs an off operation.

The cross connector 110 includes a first cross switch $M_6$ and a second cross switch $M_5$. The first cross switch $M_6$ includes a gate terminal connected to a gate of the first high side switch $M_3$ and a drain terminal connected to a gate of the second high side switch $M_4$. A source terminal of the first cross switch $M_6$ is connected to a ground terminal. The second cross switch $M_5$ includes a gate terminal connected to the gate of the second high side switch $M_4$ and a drain terminal connected to the gate of the first high side switch $M_3$. A source terminal of the second cross switch $M_5$ is connected to the ground terminal.

The first and second high side switches $M_3$ and $M_4$ operate alternately according to a change in the polarities of the input alternating current voltages $V_{INP}$ and $V_{INN}$. For example, the first high side switch $M_3$ is synchronized with the first polarity $V_{INP}$ of the input alternating current voltage to perform a switching operation, and the second high side switch $M_4$ is synchronized with the second polarity $V_{INN}$ of the input alternating current voltage to perform the switching operation.

The first low side switch $M_1$ and the second low side switch $M_2$ perform switching operations in correspondence with the second high side switch $M_4$ and the first high side switch $M_3$, respectively.

The drain terminal of the second cross switch $M_5$ is connected to the gate of the first high side switch $M_3$ and the drain terminal of the first cross switch $M_6$ is connected to the gate of the second high side switch Ma. In this regard, the first cross switch $M_6$ and the second cross switch $M_5$ perform switching operations in correspondence with the first high side switch $M_3$ and the second high side switch Ma, respectively.

Figure 4:
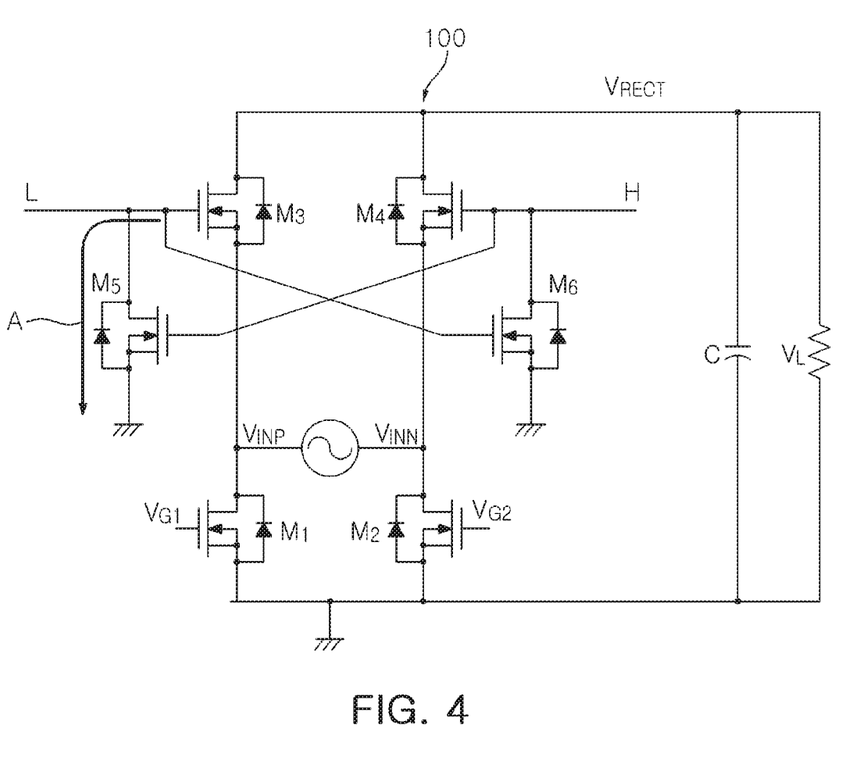
FIGS. 4 and 5 are circuit diagrams illustrating a switching off operation of the rectifier of FIG. 3.
Figure 5:
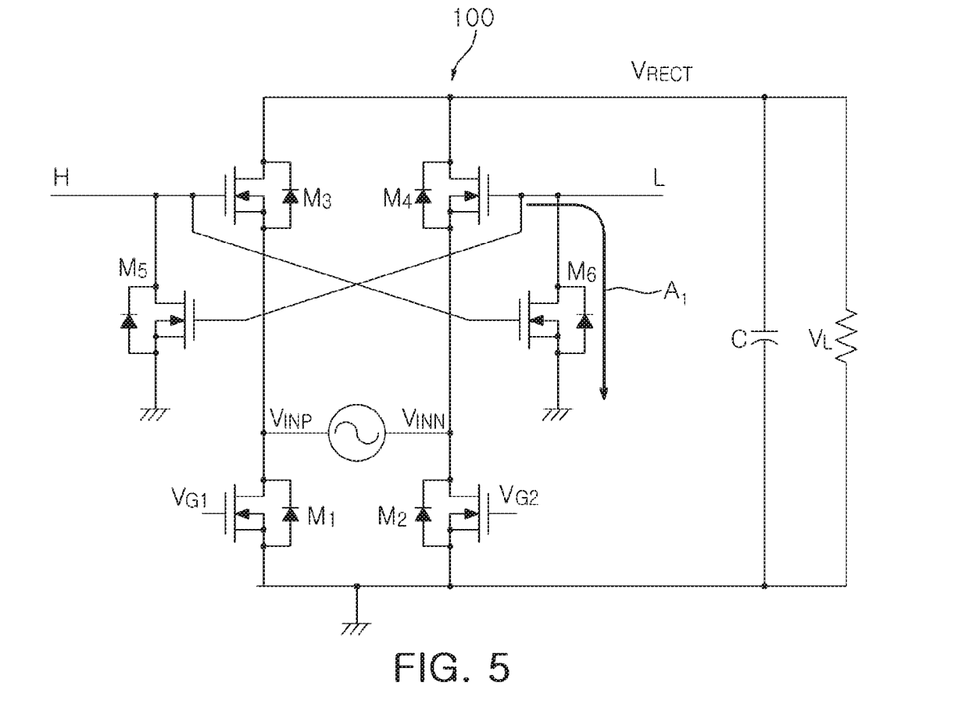

FIGS. 4 and 5 are circuit diagrams illustrating an off switching operation of the rectifier 100. Switching operations of the switches $M_1$, $M_2$, $M_3$, $M_4$, $M_5$ and $M_6$ of the rectifier 100 will be described below with reference to FIGS. 4 and 5.

The example of FIG. 4 illustrates a gate voltage of the second high side switch $M_4$, changed from having a low voltage level to having a high voltage level and a gate voltage of the first high side switch $M_3$ that is changed from having a high voltage level to having a low voltage level.

The gate voltage of the first high side switch $M_3$ is changed from having the high voltage level to having the low voltage level, and thus the gate voltage of the first high side switch $M_3$ is in a falling edge state. Meanwhile, since the gate voltage of the second high side switch $M_4$ is high, a gate voltage of the second cross switch $M_5$ is also high, and thus current is applied to the second cross switch $M_5$. Therefore, parasitic capacitance remaining in the first high side switch $M_3$ flows to a ground through the second cross switch $M_5$ in the direction of the arrow A.

An example of FIG. 5 illustrates a gate voltage of the second high side switch $M_4$ that is changed from having a high voltage level to having a low voltage level and a gate voltage of the first high side switch $M_3$ that is changed from having a low voltage level to having a high voltage level.

The gate voltage of the second high side switch $M_4$ is changed from having the high voltage level to having the low voltage level, and thus the gate voltage of the second high side switch $M_4$ is in a falling edge state. Meanwhile, since the gate voltage of the first high side switch $M_3$ is high, a gate voltage of the first cross switch $M_6$ is also high, and thus current is applied to the first cross switch $M_6$. Therefore, parasitic capacitance remaining in the second high side switch $M_4$ flows to a ground through the first cross switch $M_6$ in the direction of the arrow $A_1$.

Figure 6:
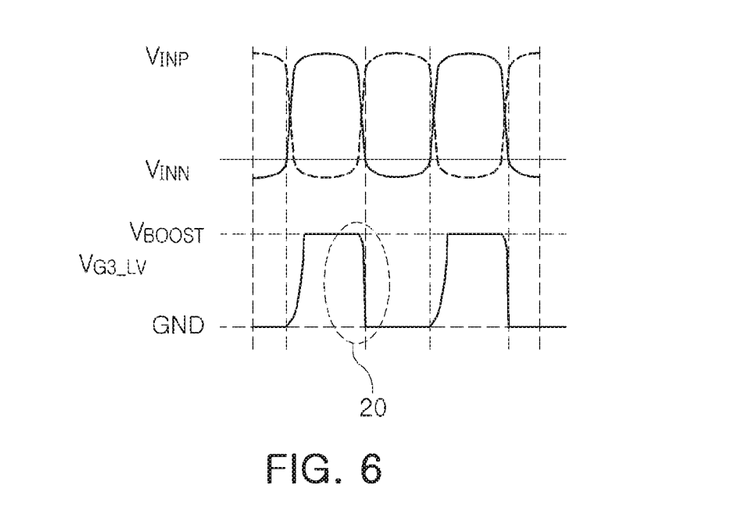
FIG. 6 is an example of a graph of a switching signal with respect to an AC voltage input to the rectifier of FIGS. 3 through 5.

FIG. 6 is a graph of a switching signal of the first high side switch $M_3$ with respect to an alternating current voltage input to the rectifier 100.

As illustrated in FIG. 6, a falling edge 20 of the first high side switch $M_3$ is more linearly formed. This is because when the first high side switch $M_3$ is changed to an off switching state, parasitic capacitance remaining in the first high side switch $M_3$ is quickly removed.

Therefore, even if a capacity of a switch included in the rectifier 100 is increased, a substantially linear falling edge is formed, and thus, switching loss may be minimized even when high voltage alternating current is input.

Figure 7:
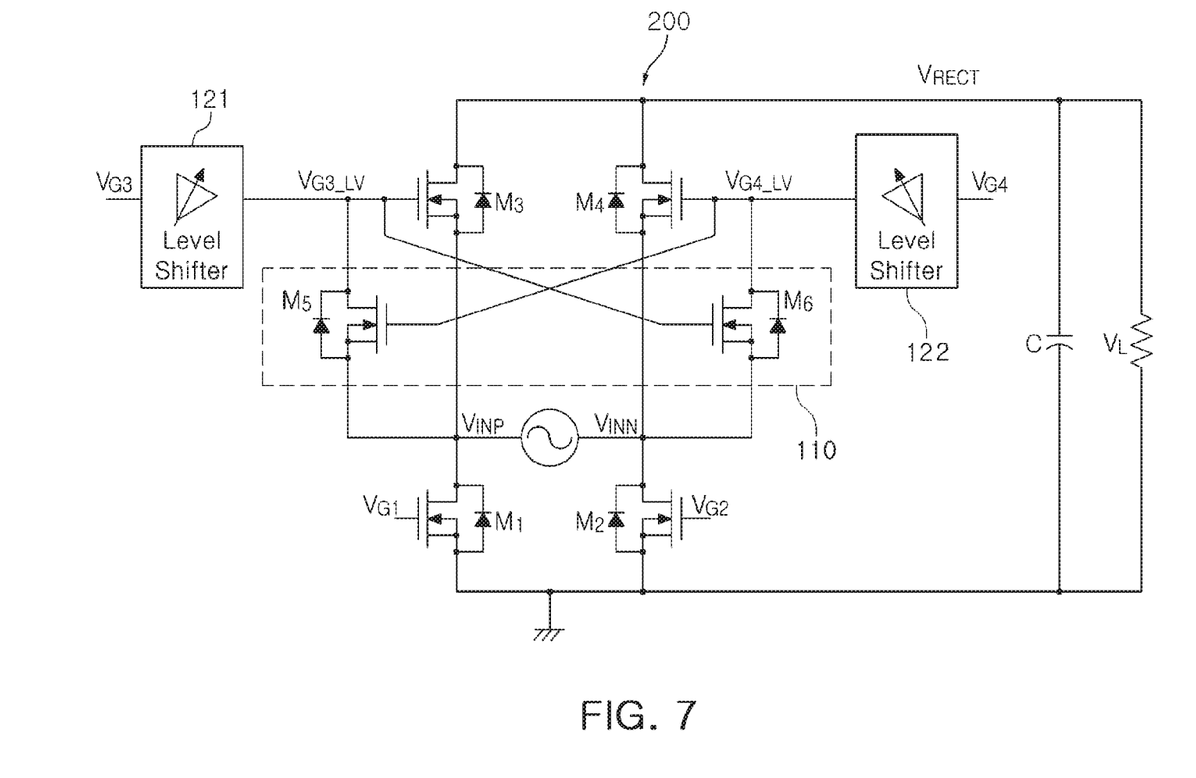
FIG. 7 is a circuit diagram of a rectifier according to another embodiment.

FIG. 7 is a circuit diagram of a rectifier 200 according to another embodiment. The rectifier 200 is similar to the rectifier 100, except that the rectifier 200 further includes a first level shifter 121 and a second level shifter 122. Thus, the configuration and operation of the switching devices $M_1$, $M_2$, $M_3$, $M_4$, $M_5$ and $M_6$ of the rectifier 200 can be understood from the preceding descriptions of the rectifier 100 provided with reference to FIGS. 3 through 6 above.

The first and second level shifters 121 and 122 are respectively connected to the gate terminals of the first and second high side switches $M_3$ and $M_4$. The first and second level shifters 121 and 122 respectively adjust gate voltages of the first and second high side switches $M_3$ and $M_4$ such that gate-source voltages of the first and second high side switches $M_3$ and $M_4$ are uniform.

The source terminals of the first and second low side switches $M_1$ and $M_2$ are connected to a ground terminal, and thus a voltage difference between the gate and source terminals ("gate-source voltage") of the first and second low side switches $M_1$ and $M_2$ can be maintained uniform (for example, 5V). Meanwhile, the source terminals of the first and second high side switches $M_3$ and $M_4$ are each connected to one of the alternating current input terminals, and thus voltages of the source terminals of the first and second high side switches $M_3$ and $M_4$ can vary. Therefore, the first and second level shifters 121 and 122 can respectively adjust the gate voltages of the first and second high side switches $M_3$ and $M_4$ such that the gate-source voltages of the first and second high side switches $M_3$ and $M_4$ are uniform.

In an embodiment, the first and second level shifters 121 and 122 are configured to detect a variable amount of the input AC voltage and shift the gate voltages of the first and second high side switches $M_3$ and $M_4$ as much as the detected amount.

Figure 8:
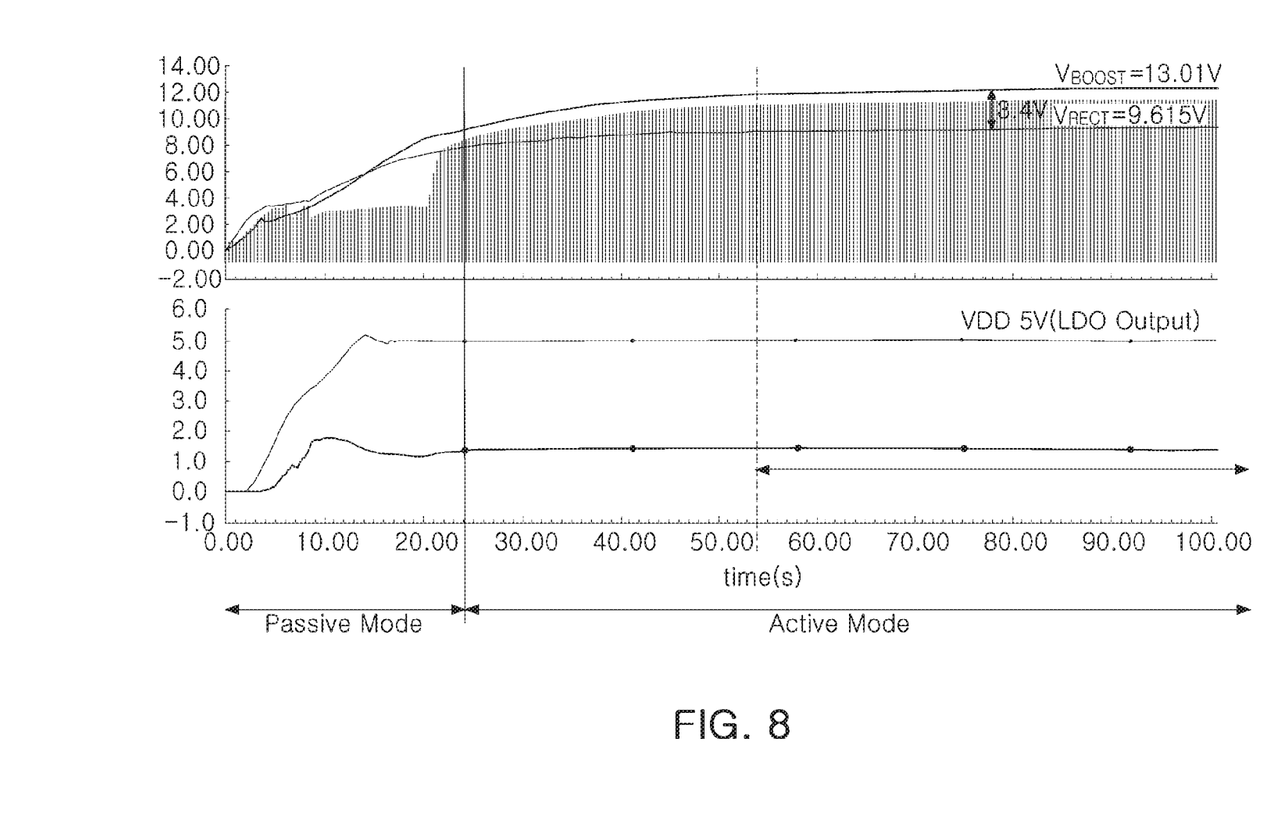
FIG. 8 is a graph illustrating an example of outputs of the rectifier of FIG. 7 with respect to an increase in the level of an AC voltage input thereto.

FIG. 8 is a graph illustrating an example of an output of the rectifier 200 with respect to an increase in the voltage level of an AC voltage input thereto. As illustrated in FIG. 8, while the rectifier 200 is changed from a passive mode, in which the level shifters 121 and 122 are not operated, to an active mode, in which the level shifters 121 and 122 are operated, the rectifier provides a stable output even when a voltage of the rectifier increases.

As set forth above, according to example embodiments disclosed herein, charges stored in a parasitic capacitor present in a switching device can be discharged at high speed when the switching device performs a switching operation, and thus a switching loss may be removed.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A rectifier comprising:
   first and second high side switches comprising source terminals connected to an alternating current input terminal and drain terminals connected to one end of an output capacitor;
   first and second low side switches comprising drain terminals connected to the alternating current input terminal and source terminals connected to a ground terminal and another end of the output capacitor; and
   a cross connector configured to allow parasitic capacitance of the first high side switch or the second high side switch to flow to a ground when the first high side switch or the second high side switch is turned off,
   wherein the cross connector comprises
      a first cross switch comprising a gate terminal connected to a gate of the first high side switch and a drain terminal connected to a gate of the second high side switch, and
      a second cross switch comprising a gate terminal connected to the gate of the second high side switch and a drain terminal connected to the gate of the first high side switch.

2. The rectifier of claim 1, wherein the first and second cross switches comprise source terminals connected to the ground terminal.

3. The rectifier of claim 1, wherein the first and second high side switches are configured to operate alternately according to a change in polarities of input alternating current voltages.

4. The rectifier of claim 3, wherein the first low side switch and the second low side switch are configured to perform switching operations in correspondence with the second high side switch and the first high side switch, respectively.

5. The rectifier of claim 4, wherein the first cross switch and the second cross switch are configured to perform switching operations in correspondence with the first high side switch and the second high side switch, respectively.

6. A rectifier comprising:
   first and second high side switches comprising source terminals connected to an alternating current input terminal and drain terminals connected to one end of an output capacitor;
   first and second low side switches comprising drain terminals connected to the alternating current input terminal and source terminals connected to a ground terminal and another end of the output capacitor;
   a cross connector configured to allow parasitic capacitance of the first high side switch or the second high side switch to flow to a ground when the first high side switch or the second high side switch is turned off; and
   first and second level shifters respectively connected to gate terminals of the first and second high side switches,
   wherein the cross connector comprises
      a first cross switch comprising a gate terminal connected to a gate of the first high side switch and a drain terminal connected to a gate of the second high side switch, and
      a second cross switch comprising a gate terminal connected to the gate of the second high side switch and a drain terminal connected to the gate of the first high side switch.

7. The rectifier of claim 6, wherein the first and second level shifters are configured to respectively adjust gate voltages of the first and second high side switches such that gate-source voltages of the first and second high side switches are uniform.

8. The rectifier claim 6, wherein the first and second cross switches comprise source terminals connected to the ground terminal.

9. The rectifier of claim 6, wherein the first and second high side switches are configured to operate alternately according to a change in polarities of input alternating current voltages.

10. The rectifier of claim 9, wherein the first low side switch and the second low side switch are configured to perform switching operations in correspondence with the second high side switch and the first high side switch, respectively.

11. The rectifier of claim 10, wherein the first cross switch and the second cross switch are configured to perform switching operations in correspondence with the first high side switch and the second high side switch, respectively.

12. A rectifier comprising:
   first and second high side switches comprising source terminals connected to an alternating current input terminal and drain terminals connected to one end of an output capacitor;
   first and second low side switches comprising drain terminals connected to the alternating current input terminal and source terminals connected to a ground terminal and another end of the output capacitor;
   a first cross switch comprising a gate terminal connected to a gate of the first high side switch and a drain terminal connected to a gate of the second high side switch; and
   a second cross switch comprising a gate terminal connected to the gate of the second high side switch and a drain terminal connected to the gate of the first high side switch.

13. The rectifier of claim 12, wherein:
   the first cross switch is configured to allow parasitic capacitance in the second high side switch to flow to a ground through the first cross switch; and
   the second cross switch is configured to allow parasitic capacitance in the first high side switch to flow to a ground through the second cross switch.

14. The rectifier of claim 12, further comprising level shifters connected to gate terminals of the first and second high side switches and configured to adjust gate voltages of the first and second high side switches such that gate-source voltages of the first and second high side switches are uniform.

15. A rectifier comprising:
first and second high side switches comprising source terminals connected to an alternating current input terminal and drain terminals connected to one end of an output capacitor;
first and second low side switches comprising drain terminals connected to the alternating current input terminal and source terminals connected to a ground terminal and another end of the output capacitor;
a first cross switch connected to the first high side switch and the second high side switch, and configured to allow parasitic capacitance of the second high side switch to flow to a ground through the first cross switch; and
a second cross switch connected to the first high side switch and the second high side switch, and configured to allow parasitic capacitance of the first high side switch to flow to the ground through the second cross switch.

* * * * *